United States Patent
Takahashi et al.

(10) Patent No.: US 6,771,729 B1
(45) Date of Patent: Aug. 3, 2004

(54) CLOCK RECOVERY CIRCUIT AND TRANSMITTER-RECEIVER THEREWITH

(75) Inventors: Miki Takahashi, Tokyo (JP); Yasushi Wakayama, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 687 days.

(21) Appl. No.: 09/670,164

(22) Filed: Sep. 26, 2000

(30) Foreign Application Priority Data

Sep. 27, 1999 (JP) .......................................... 11-272038

(51) Int. Cl.[7] .............................................. H03D 3/24
(52) U.S. Cl. ...................... 375/376; 375/374; 375/327; 327/148; 327/157
(58) Field of Search ............................... 375/374, 376, 375/326, 327; 327/147, 148, 156, 157; 331/17, 18

(56) References Cited

U.S. PATENT DOCUMENTS

| | | | |
|---|---|---|---|
| 5,220,294 A | * 6/1993 | Ichikawa | 331/17 |
| 5,950,115 A | * 9/1999 | Momtaz et al. | 375/327 |
| 5,952,890 A | * 9/1999 | Fallsgaard et al. | 331/18 |
| 6,218,876 B1 | * 4/2001 | Sung et al. | 327/156 |

FOREIGN PATENT DOCUMENTS

| | | |
|---|---|---|
| JP | 05-090962 | 4/1993 |
| JP | 06-029836 | 2/1994 |
| JP | 06-045922 | 2/1994 |
| JP | 07-079158 | 3/1995 |
| JP | 2001-016102 | 1/2001 |
| JP | 2001-016103 | 1/2001 |

* cited by examiner

*Primary Examiner*—Temesghen Ghebretinsae
(74) *Attorney, Agent, or Firm*—Katten Muchin Zavis Rosenman

(57) ABSTRACT

A clock recovery circuit, according to the present invention, generates a clock signal that continuously maintains a fixed phase to an input data signal. It is made up of a phase comparator, charge pumps, loop filter, VCO, frequency-divider, and selector. The VCO generates the frequency of a first clock signal in direct proportion to the value of a voltage signal given by the loop filter. The frequency-divider frequency-divides the first clock signal into a resulting second clock signal The selector selects either said first clock signal or said second clock signal to be a recovery clock, in conformity with a selective signal. This selective signal directs said selector to select said first clock signal when said input data signal is of a high frequency; otherwise, to select said second clock signal when said input data signal is of a low frequency. The charge pump outputs a VCO control electric current, with its amount being decided by said selective signal. The loop filter filters out predetermined high frequency components in said VCO control electric current and converts it to said voltage signal.

5 Claims, 4 Drawing Sheets

CLOCK RECOVERY CIRCUIT AND TRANSMITTER-RECEIVER THEREWITH

BACKGROUND OF THE INVENTION

1. Field of the Invention

The present invention concerns a clock recovery circuit with a voltage-controlled oscillator, which generates a clock that continuously maintains a fixed phase to each piece of input data, and a transmitter-receiver therewith.

2. Description of the Related Arts

When data is exchanged in data communication such as that between mobile telecommunication devices, data and a clock used for processing that data are generally necessary. In that case, for example, assuming that data is being exchanged between area A and area B, naturally, the exchange of data and clock between A and B is necessary. But in recent years, because the amount of data being exchanged has greatly increased and transfer rates have become increasingly fast, it is desirable to have as few signals as possible.

Which lead to the question now of whether data-only can just be sent instead of before where once both data and clock needed to be sent together. It is here that a clock recovery circuit is applicable.

A clock recovery circuit can come up with a clock synchronized to the data based solely on a data-only signal, and to give an example, if the data sent comes in at 500 Mbps, the clock recovery circuit sets up a 500 MHz clock based on that data. At this time, this clock is completely synchronized to the data, and generated with a constant phase to the data.

The reason the clock phase is aligned with the data comes from the fact that the clock generated by the clock recovery circuit is necessary for processing data, and a series of data processing, such as reading out data, is preformed in sync with the timing of the clock. To explain it more specifically, in a process that has been set to read-in data timed with the rising edge of the clock signal, for example, if the read-out is performed with the same timing, the danger of an erroneous (misaligned) read-out virtually disappears. However, if the timing of the data being read-in is inconsistent or random, it is possible that data that has already been read-in might be read-in again. Also, even if the read-out timing has been made constant, when the data read-out position (which is designated by the clock) falls within the transient region of the data, the receiving-side might have difficulty recognizing which data has been read-in before and after the transient region of data. In order to solve this problem, it is necessary to synchronize each of the clock phases to a constant position of each piece of data.

By using the clock recovery circuit in this manner, since the clock for data processing has been generated solely from only the data that has been sent, data communication between A and B can take place without the extra step of sending a data processing clock.

However, the following problems have arisen with conventional technology and are described below.

Conventionally, a wideband VCO (voltage-controlled oscillator) was needed when planning the layout of a wideband clock recovery circuit. However, with regard to manufacturing process variations, environmental variations and the like, it is exceedingly difficult to make a VCO that can guarantee a wide range of oscillations.

In order to design a clock recovery circuit, it is normally necessary to take into consideration beforehand the manufacturing process variations, environmental variations, and the like. These variations cause the occurrence of different guaranteed oscillation ranges of a VCO. For example, assume the information below is obtained as a result of planning.

Good conditions: VCO oscillates within the range of 200 MHz to 600 MHz

Normal conditions: VCO oscillates within the range of 150 MHz to 600 MHz

Poor conditions: VCO oscillates within the range of 100 MHz to 600 MHz In this case, the oscillation range guaranteed by all conditions is 200 MHz (the lowest oscillation frequency during "good conditions") to 400 MHz (the highest oscillation frequency during "poor conditions"). In this manner, designing a clock recovery circuit, while keeping in mind the changes involved in semiconductor manufacturing processes, causes an occurrence of unavoidable problems making designing a widened oscillation range quite difficult to accomplish.

SUMMARY OF THE INVENTION

Accordingly, the present invention takes the above problems into consideration, with its objective being to provide a wideband clock recovery circuit depending on a frequency-dividing formula without a wideband VCO, and also to provide a transmitter-receiver therewith. The key point to attain the above objective is to control the problematic changes in the loop gain that are caused by the changes in the frequency-division factor. With this control, the clock recovery circuit, according to the present invention, can maintain the characteristic stability in all of the various frequencies.

According to an aspect of the present invention, a clock recovery circuit, which generates a recovery clock signal (CLOCK) that continuously maintains a fixed phase to an input data signal (DATA), is provided and is comprised of a frequency-divider (2), which frequency-divides a first clock signal (clock 1) by a selectable frequency-division factor into a resulting second clock signal (clock 2); and a charge pump (9), which outputs a selectable amount of VCO control electric current, wherein said selectable amount of VCO control electric current is selected in conformity with said selectable frequency-division factor. An example of this clock recovery circuit is shown in FIG. 1.

According to an aspect of the present invention, a transmitter-receiver is provided and is comprised of a demodulator (102), which demodulates an input data signal; and a recovery clock/data recovery circuit (101), which generates a recovery clock (CLOCK) and recovered data, with said recovery clock (CLOCK) continuously maintaining a fixed phase to modulated input data signal (DATA). The recovery clock/data recovery circuit (101) is comprised of a frequency-divider (2), which frequency-divides a first clock signal (clock 1) by a selectable frequency-division factor into a resulting second clock signal (clock 2); and a charge pump (9), which outputs a selectable amount of VCO control electric current, wherein said selectable amount of VCO control electric current is selected in conformity with said selectable frequency-division factor. An example of this transmitter-receiver is shown in FIGS. 5 and 6.

BRIEF DESCRIPTION OF DRAWINGS

The above and other objects, features and advantages of the present invention will become more apparent from the following detailed description when taken in conjunction with the accompanying drawings, wherein.

PREFERRED EMBODIMENTS OF THE PRESENT INVENTION

Hereafter a clock recovery circuit of an embodiment, according to the present invention, will be described in reference to the drawings.

Figure 1:
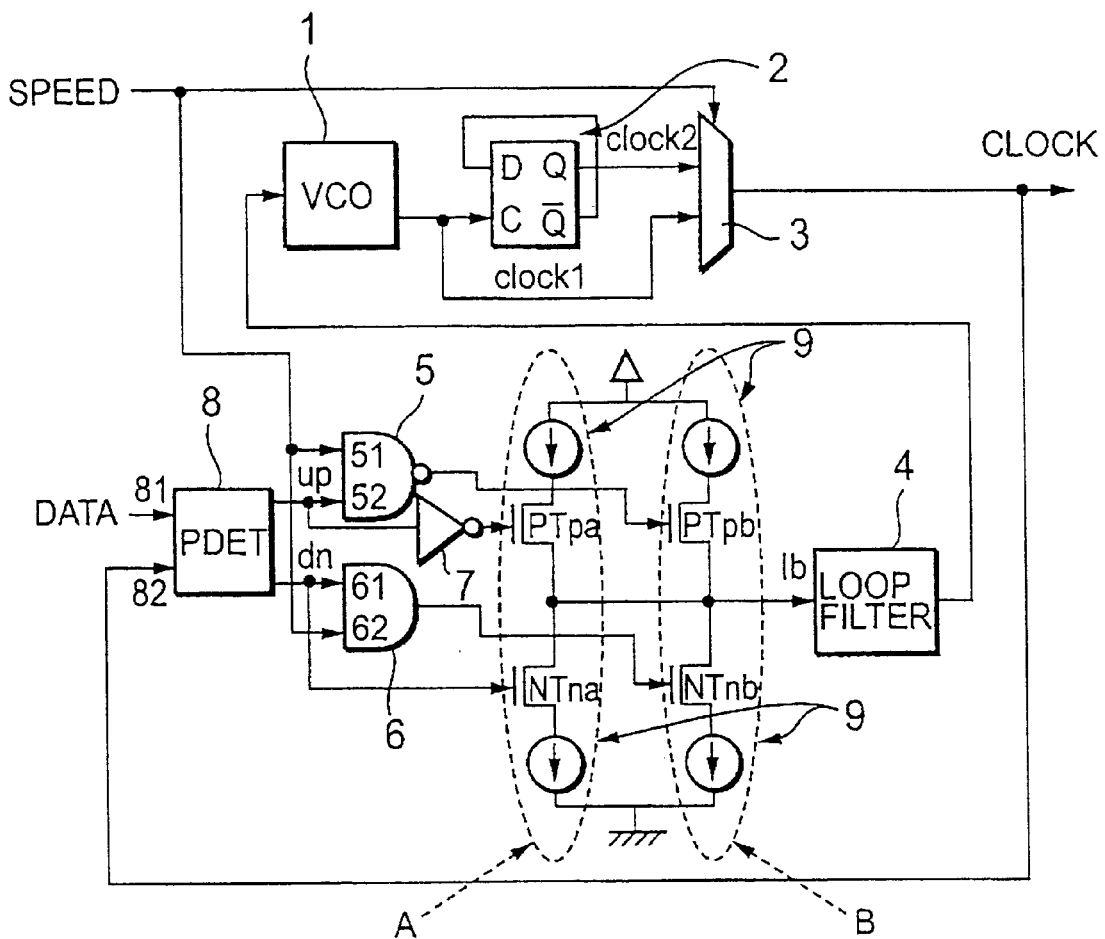
FIG. 1 is a circuit block diagram showing the structure of a clock recovery circuit, according to an embodiment of the present invention.

As shown in FIG. 1, a clock recovery circuit 10 of this embodiment is comprised of a VCO (voltage-controlled oscillator) 1, phase comparator 8, charge pumps A, B, loop filter 4. In order to accommodate wideband frequencies, the clock recovery circuit 10 is further comprised of a flip-flop frequency divider 2 and recovery clock selector 3. The phase comparator 8 compares input data signal (DATA) to a clock signal (CLOCK), which is a feedback signal given back from selector 3, thus detecting the difference between the phases of the above two.

The output of the loop filter 4 is input into the VCO 1. The VCO 1 generates and outputs a frequency of a clock signal in conformity with the output of the loop filter 4. The output of the VCO 1 is input to both the selector 3 and the frequency divider 2 (which is made up of a D-type flip flop) as clock signal (clock 1). The frequency divider 2 divides clock 1 by two into a half-frequency clock signal (clock 2), which then enters the selector 3.

Selector 3 then selects either clock 1 or clock 2 depending on a selective signal SPEED and then outputs the one that has been selected as the recovery clock signal (CLOCK). In this embodiment it is set so that if the selective signal SPEED is low, then clock 1 is selected, likewise if the selective signal SPEED is high, then clock 2 is selected.

The output from selector 3 is connected to the input terminal 82 of the phase comparator 8. The phase comparator 8 receives two signals: Input data DATA (at terminal 81) and the above CLOCK (at terminal 82), determining the phase difference between the two received signals, and then accordingly generating an up-signal UP and down-signal DN. The up-signal UP branches off entering both input terminal 52 of NAND gate 5 and inverter 7. The inverter 7 receives and inverts the up-signal UP, outputting resulting inverted up-signal to the gate of PMOS transistor Tpa in charge pump A.

Down-signal DN branches off entering both the gate of NMOS transistor Tna in the charge pump A and the input terminal 61 of AND gate 6. Furthermore, a selective signal SPEED is given to the input terminal 51 of NAND gate 5, the input terminal 62 of AND gate 6, and the selective terminal of the selector 3. The output from NAND gate 5 is connected to the gate of PMOS transistor Tpb in the charge pump A and the output from AND gate 6 to the gate of NMOS transistor Tnb also in the charge pump A. The outputs of the charge pumps A and B, are both input to loop filter 4. The loop filter 4 then filters out certain high frequency components in the output from the charge pumps A and B, thus outputting the resulting output voltage to VCO 1.

Next the circuit operations of the clock recovery circuit 10 in FIG. 1, according to the present invention, will be described in reference to the drawings.

First, the workings of each circuit block will be explained. VCO 1 is a voltage-controlled oscillator. In other words, it is a circuit where a change in the input control voltage results in a change in its oscillating frequency. Its voltage characteristics are such that as the input control voltage increases, its oscillation frequency increases. Normally, when recovery is attempted for data with a wide range of frequencies, it is usually required that the VCO has the same oscillation bandwidth as the frequency bandwidth of the data it will be dealing with.

Charge pumps A and B will be now explained along with loop filter 4. Charge pump A is made up of two current sources 9 (seen on the left side of the circuit made up of charge pumps A and B), PMOS transistor Tpa, and NMOS transistor Tna; Charge pump B is comprised of the other two current sources 9 (seen on the right side of the circuit made up of charge pumps A and B), PMOS transistor Tpb, and NMOS transistor Tnb. When charge pumps A and B each have their respective PMOS transistors Tpa and Tpb turned on, the total electric current of the respective outputs from these two transistors or charge-pump electric current Ib is allowed to flow into loop filter 4. On the other hand, when NMOS transistors Tna and Tnb turn on, charge-pump electric current Ib flows out of loop filter 4 into the NMOS transistors. The output voltage of the loop filter 4 varies depending on the charging/discharging of the loop filter 4 with charge-pump electric current Ib by these charge pumps A and B. Specifically, when charge-pump electric current Ib is charging, the output voltage of the loop filter 4 is high; otherwise when it is discharging, its output voltage is low. In the present invention, there are two charge pumps A and B with exactly the same electric current drive capacity; therefore by actuating both at the same time, the amount of charge-pump electric current Ib can be doubled.

Next the phase comparator 8 will be explained. The phase comparator 8 is a circuit that compares the input data (DATA) to the input clock (CLOCK), thus detecting a difference between the phases of the above two, and then generating an up-signal UP and a down-signal DN depending on the said difference, so that the phase between the DATA and CLOCK can be adjusted to a desired phase.

Figure 2:
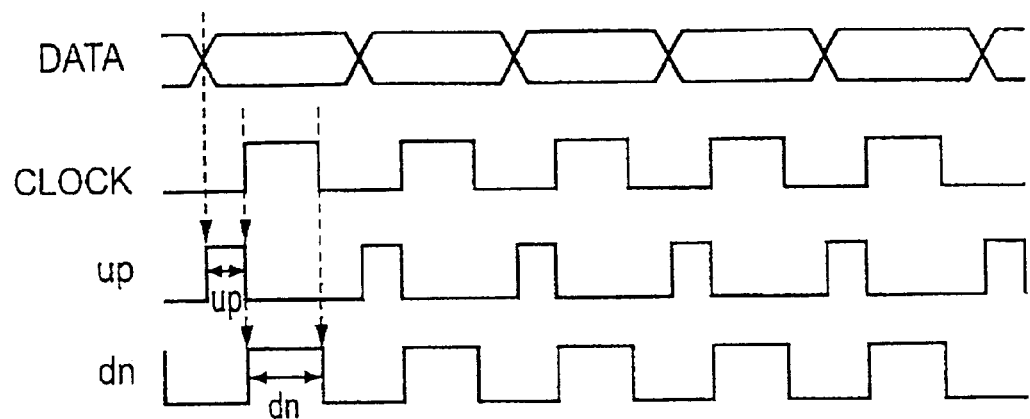
FIG. 2 is a timing chart showing conditions when the phases of a CLOCK, which is output from the clock recovery circuit and enters the phase comparator 8, are fast relative to DATA, which enters the same in FIG. 1.

The operation of the phase comparator 8 will now be explained with reference to FIG. 2. As shown in this Figure, signal UP is output for the width from the rising edge of the DATA until the rising edge of the CLOCK. Signal DN is output for half the length of the CLOCK immediately after the point of time where signal UP falls. The charging/discharging of loop filter 4 from charge pumps A and B corresponds to the width of the pulses of these signals UP and DN. The loop filter 4 filters out certain high frequency components, and then outputs the resulting voltage to VCO 1. VCO 1 generates and outputs a frequency of a clock signal depending on the resultant voltage.

Figure 3:
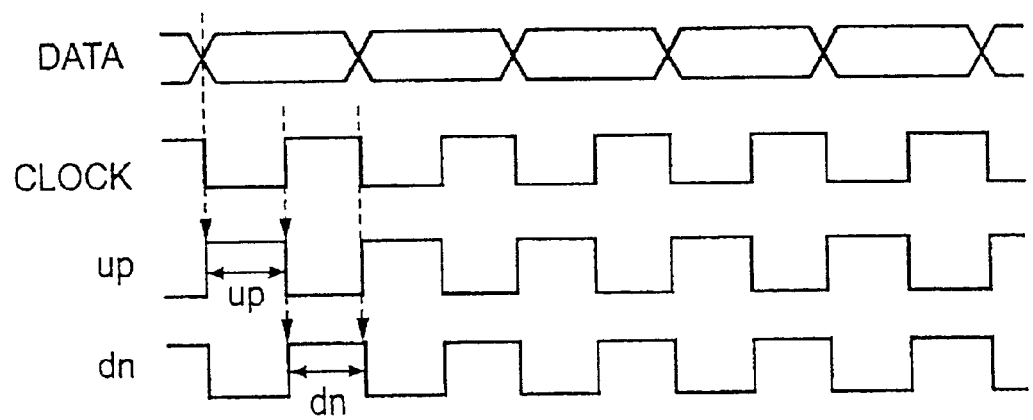
FIG. 3 is a timing chart showing conditions when the phases of the CLOCK are in sync with the DATA.
Figure 4:
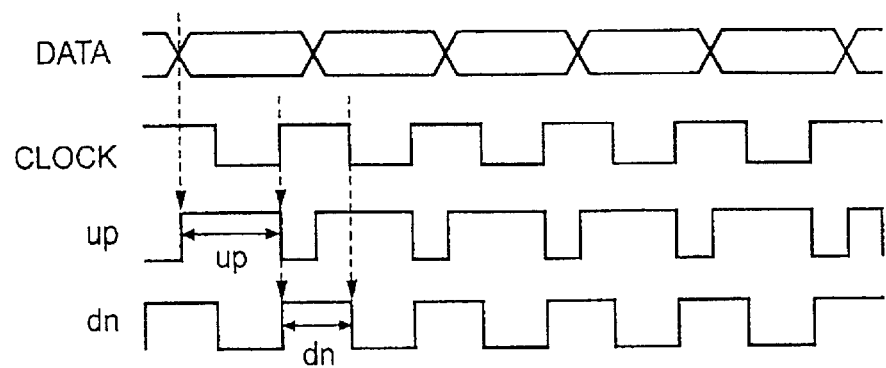
FIG. 4 is a timing chart showing conditions when the phases of the CLOCK are slow relative to the DATA.

As shown in FIG. 3, when the position of the rising edge of the CLOCK is in the middle of the DATA, the widths of signals UP and DN become the same and the amount of charging/discharging becomes balanced. On the other hand, as shown in FIG. 2, when the phases of signal UP are advanced forward compared to those of signal DN (or the phases of the CLOCK are advanced forward of those of the DATA), the width of the signal UP pulse shortens. Likewise, as shown in FIG. 4, when the phases of signal UP is delayed compared to those of signal DN (or the phases of the CLOCK are delayed compared to those of the DATA), the width of the signal UP pulse lengthens. The width of the signal DN pulse is fixed to be equal to half that of the CLOCK with no relation to the phase position of the signal DN away from signal UP, so the difference between the pulse widths of signals UP and DN originates solely in the change in the pulse width of signal UP.

The workings of the circuit as a whole will now be explained with reference to FIG. 1.

A clock-recovery circuit 10, according to the present invention, is a circuit that forms a recovery clock signal CLOCK, which is synchronized to input data DATA and further has a characteristic whereby it aligns the phase position of the CLOCK to the center of the DATA.

The fundamental operation of the clock-recovery circuit 10 is of a feedback loop that repeatedly a) inputs the DATA, which has been input to phase comparator 8 from the outside, and the CLOCK originally generated from the VCO 1;

b) drives charge pumps A and B by signals UP and DN, which correspond that phase difference between the above two inputs, causing the generation of a VCO control voltage; and c) controls the oscillating frequency of VCO 1 by the VCO control voltage.

By repeating this feedback operation, recovery-clock signal CLOCK progressively converts into a steady state as shown in FIG. 3 where the elimination in difference between the pulse widths of signals UP and DN is made, with the signal UP being generated from the phase difference between the DATA and the CLOCK. This makes it possible to generate a recovery-clock signal CLOCK that is synchronized to the DATA.

In addition to the above-mentioned operational elements that comprise the clock-recovery circuit 10, the frequency divider (or toggle flip flop) 2 and selector 3 are placed after the VCO 1. The frequency divider 2 frequency-divides by two the recovery clock or clock 1 output from the VCO 1 into resulting clock 2. The usage of this clock 2 as the CLOCK makes it possible to deal with input data with a frequency that is half that of clock 1. Selector 3 is used to select either clock 1 or clock 2 in conformity with a selective signal SPEED. When the selective signal SPEED is high, clock 2 is selected. On the other hand, when it is low corresponding to a data rate that is half the oscillating frequency of VCO 1, clock 1 is selected. This allows for recovery of input data signal DATA with a data rate equal to the oscillating frequency of VCO 1.

Incidentally, when using this method of frequency division, because clock 2, which resulted from frequency-dividing the clock 1 from the VCO 1 by two, is used as a recovery clock signal CLOCK, the gain of VCO 1 appears to be halved.

Considering a clock recovery loop transfer function, the loop transfer function (open loop) G(s) that is used when an ordinary VCO clock is being recovered is given as follows:

$$G(s)=Ib \cdot N \cdot F(s) \cdot Ko/2\pi s \quad (1)$$

Ib: charge-pump electric current
N: data rate of change
F(s): filter transfer function
Ko: VCO gain On the other hand, when an n-frequency divided clock is used to perform recovery, G(s) is given as follows:

$$G(s)=Ib \cdot N \cdot F(s) \cdot (Ko/n)/2\pi s \quad (2)$$

Comparing the two formulas (1) and (2), it is noted that term 1/n has been added to formula (2).

In the present invention, the VCO gain, which changes when a frequency divider (a toggle flip-flop) 2 is used, is supplemented with the charge pump gain in order to prevent the occurrence of a problematic situation where loop characteristics diverge based upon which is selected to perform recovery, clock 1 from VCO 1 or clock 2, the frequency-divided clock.

In short, in the above transfer function, if Ib·(Ko/n) is constant, then the loop transfer function G(s) is made constant. So it follows that when a clock resulting from frequency-dividing by two is used like it is in the clock recovery circuit 10 according to the present invention, because n=2, the clock recovery circuit 10 allows an electric current that is double the charge-pump electric current Ib to flow to charge pumps A and B, thereby making the term of Ib·(Ko/n) constant and reducing the change in loop gain.

As for a method for controlling or changing the value of charge-pump electric current Ib, the clock-recovery circuit 10, according to the present invention, provides charge pumps A and B with the exact same functions and characteristics. When clock 1 is selected, only charge pump A is actuated; however when clock 2 is selected, both charge pumps A and B are simultaneously actuated in order to double the amount of charge-pump electric current Ib. This selecting is done according to the selective signal SPEED. If the selective signal SPEED is high, then signals UP and DN are input via NAND gate 5 and AND gate 6, into the respective gates of PMOS transistor Tpb and NMOS transistor Tnb in charge pump B. As a result, charge pumps A and B both begin operating, an electric current, which is double the charge-pump electric current Ib when clock 1 is selected by the selector 3, is supplied to loop filter 4. Accordingly, even when clock 2 is selected, the same loop characteristics as those for clock 1 are obtained, and a clock (CLOCK) that stably tracks the input data signal DATA with its changeable phase can be generated. Furthermore, this method is not only applicable for frequency division by two, but is applicable for n=(any given integer). For this n accordingly, the provided charge-pump electric current can be increased by multiples of n.

By forming the clock-recovery circuit 10 of the embodiment, according to the present invention, as mentioned above, the following results are achieved.

In an ordinary clock-recovery circuit, in order to provide a wideband clock-recovery circuit, a wideband VCO is necessary because the frequencies of the input data signal and oscillation clock signal issued by the VCO are the same. However, with the clock-recovery circuit 10, according to the present invention, either clock 1 issued directly from VCO 1 or clock 2 resulting from frequency-dividing the clock 1 by two is selected by selector 3 to be the recovery clock signal CLOCK. For example if a VCO with an oscillation band of 300 MHz to 500 MHz is used, ordinary methods can only recover data signals with frequencies between 300 MHz and 500 MHz; but with the frequency division method mentioned above, if a frequency-halved clock is used as the recovery clock, it is possible to recover data signals with frequencies between 250 MHz and 150 MHz in addition to the ordinary frequencies ranging from 300 MHz to 500 MHz. According to the present invention, even in a limited VCO band, it is possible to broaden the band that can be retained for clock recovery.

Further, with the frequency-division method, according to the present invention, gain adjustment is performed by changing the total amount of charge-pump electric current Ib in accordance with the change in loop characteristics, which results from the change in the VCO gain that is caused by the frequency dividing. The aforementioned transfer function explains that change in the loop characteristics. The performing of the gain adjustment allows the clock-recovery circuit, according to the present invention, to have unchangeable loop characteristics regardless of whether or not a frequency-dividing circuit exists.

Figure 5:
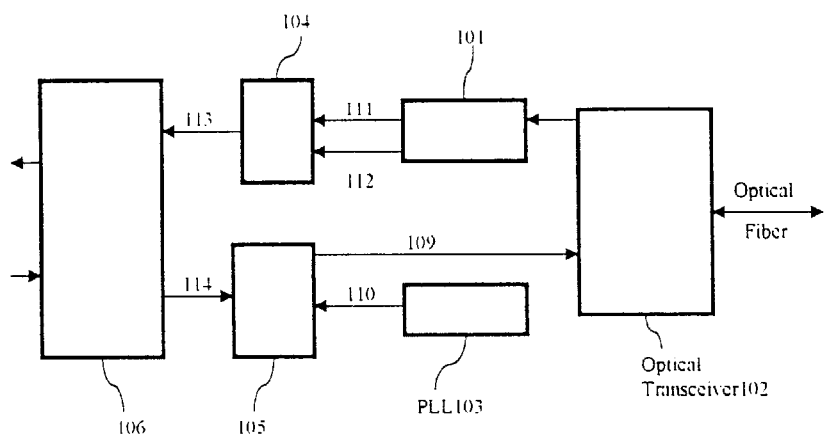
FIG. 5 shows the configuration of a transmitter-receiver with the clock recovery circuit, according to the present invention.
Figure 6:
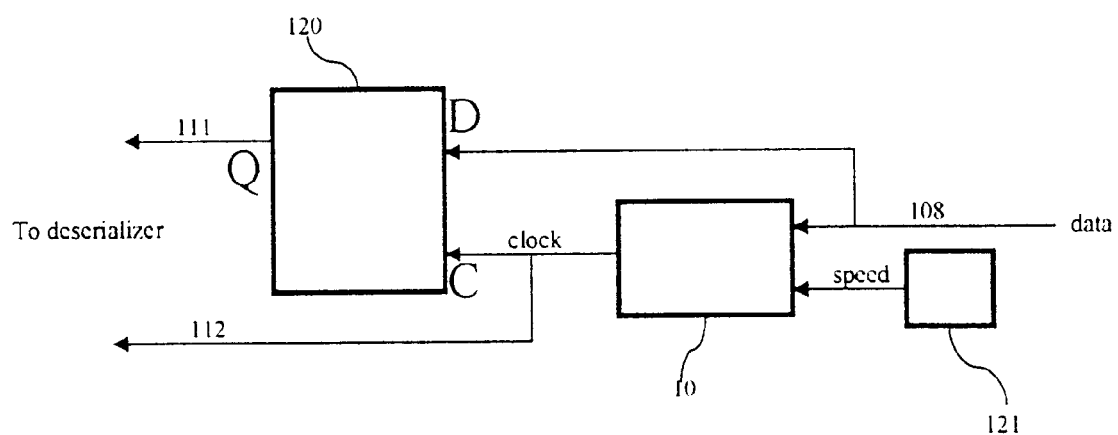
FIG. 6 shows the configuration of a clock/data recovery circuit 101 in the transmitter-receiver, according to the present invention.

Next, an application circuit with the clock recovery circuit 10 is described with reference to FIGS. 5 and 6. FIGS. 5 and 6 illustrate the configuration of a transmitter-receiver 100 with the clock recovery circuit 10 of an embodiment, according to the present invention.

As referred to in FIG. 5, the transmitter-receiver 100 is made up of an optical fiber 107, optical transceiver 102, clock/data recovery circuit 101, deserializer 104, logic block 106, serializer 105, and PLL circuit 103. As referred to in FIG. 6, the clock/data recovery circuit 101 is made up of the clock recovery circuit 10 as shown in FIG. 1, according to the present invention; band selector 121, which gives the clock recovery circuit 10 a selective signal SPEED; and D-type flip-flop 120, which fetches each piece of input data (DATA) 108 in sync with the clock signal (CLOCK) generated by the clock recovery circuit 10, then outputs each fetched piece of the DATA 111.

In FIG. 5, upon reception of optical data via the optical fiber 107, the optical transceiver 102 demodulates the received optical data and converts the demodulated optical data to corresponding electric data signals, then outputs them to the clock/data recovery circuit 101. Upon reception of the output electric data signals, the clock/data recovery circuit 101 generates a recovery clock signal CLOCK from them, and successfully fetches them in sync with the CLOCK, and then outputs both the generated CLOCK (112) and fetched DATA (111) to the deserializer 104. The deserializer 104 then receives them and converts the fetched DATA (111) to parallel data 113. The logic block 106 then subjects the fetched DATA (111) to a predetermined process. On the other hand, in the case when the transmitter-receiver 100 transmits data to the optical fiber 107, the logic block 106 generates routing information, which designates a route via which the data is transmitted to a destination, and then outputs it with the data to the serializer 105. Once they are received, the serializer 105 converts them to corresponding serial data, and then modulates the serial data by the help of the PLL circuit 103, thus outputting a resulting modulated serial data 108 to the optical transceiver 102. The optical transceiver 102 then converts the modulated serial data 108 to corresponding optical data signals, thus transmitting them via the optical fiber 107.

It is apparent that other types of communication systems, such as SONET, SDH, Fiber Channel and Gigabit Ethernet, can be performed by a similar configuration to that in FIG. 5.

Furthermore, the clock recovery circuit 10, according to the present invention, can be used for a mobile telecommunication device.

Furthermore, the number, placement, and form, etc. of the above-mentioned elements are not limited to those described in the above embodiments; therefore it is possible to provide a structure similar to the above embodiments, according to the present invention, with suitable number, placement and form, etc. of the above-mentioned elements.

A clock-recovery circuit and transmitter-receiver therewith, according to the present invention, have been described in connection with several preferred embodiments. It is to be understood that the subject matter encompassed by the present invention is not limited to those specified embodiments. On the contrary, it is intended to include as many alternatives, modifications, and equivalents as can be included within the spirit and scope of the following claims.

What is claimed is:

1. A clock recovery circuit, which generates a recovery clock signal that continuously maintains a fixed phase to an input data signal, comprising:

a frequency-divider, which frequency-divides a first clock signal by a selectable frequency division factor into a resulting second clock signal; and a charge pump, which outputs a selectable amount of VCO control electric current, wherein said selectable amount of VCO control electric current is selected in conformity with said selectable frequency-division factor, wherein said charge pump is comprised of a plurality of sub-charge pumps, wherein number of said plurality of sub-charge pumps that are allowed to work simultaneously is decided in conformity with said selectable frequency-division factor, and wherein the number of said plurality of sub-charge pumps that are allowed to work simultaneously is low when a low value is selected for said selectable frequency-division factor; otherwise number of said sub-charge pumps (9) that are allowed to work simultaneously is high when a high value is selected for said selectable frequency-division factor.

2. A clock recovery circuit, which generates a recovery clock signal that continuously maintains a fixed phase to an input data signal, comprising:

a frequency-divider, which frequency-divides a first clock signal by a selectable frequency division factor into a resulting second clock signal; and a charge pump, which outputs a selectable amount of VCO control electric current, wherein said selectable amount of VCO control electric current is selected in conformity with said selectable frequency-division factor, wherein said charge Pump is comprised of a plurality of sub-charge pumps, wherein number of said plurality of sub-charge pumps that are allowed to work simultaneously is decided in conformity with said selectable frequency-division factor, and wherein of said plurality of sub-charge pumps, at least one sub-charge pump is allowed to work regardless of said selectable frequency-division factor, and the other at least one sub-charge pump is allowed to work in conformity with said selectable frequency-division factor, wherein when said other at least one sub-charge pump is allowed to work, total amount of VCO control electric current from said sub-charge pumps is output.

3. A clock recovery circuit, which generates a clock signal that continuously maintains a fixed phase to an input data signal, comprising:

a voltage-controlled oscillator (1), which generates a frequency of a first clock signal in direct proportion to the value of a voltage signal;

at least one frequency-divider, which frequency-divides said first clock signal into a resulting second clock signal;

a selector (3), which selects either said first clock signal (clock 1) or said second clock signal to be a recovery clock (CLOCK); and a charge pump, which outputs a VCO control electric current, with its amount being decided by said selective signal, wherein said charge pump is comprised of a plurality of sub-charge pumps, wherein number of said plurality of sub-charge pumps that are allowed to work simultaneously is decided by said selective signal.

4. A clock recovery circuit, which generates a clock signal that continuously maintains a fixed phase to an input data signal, comprising:

a voltage-controlled oscillator (1), which generates a frequency of a first clock signal in direct proportion to the value of a voltage signal;

at least one frequency-divider, which frequency-divides said first clock signal into a resulting second clock signal;

a selector (3), which selects either said first clock signal (clock 1) or said second clock signal to be a recovery clock (CLOCK); and a charge pump, which outputs a VCO control electric current, with its amount being decided by said selective signal, wherein said charge pump is comprised of a plurality of sub-charge pumps, wherein number of said plurality of sub-charge pumps that are allowed to work simultaneously is decided by said selective signal, and wherein the number of said plurality of sub-charge pumps that are allowed to work simultaneously is low when said input data signal is of a high frequency, otherwise, it is high when said input data signal is of a low frequency.

5. A clock recovery circuit, which generates a clock signal that continuously maintains a fixed phase to an input data signal, comprising:

a voltage-controlled oscillator (1), which generates a frequency of a first clock signal in direct proportion to the value of a voltage signal;

at least one frequency-divider, which frequency-divides said first clock signal into a resulting second clock signal;

a selector (3), which selects either said first clock signal (clock 1) or said second clock signal to be a recovery clock (CLOCK); and a charge pump, which outputs a VCO control electric current, with its amount being decided by said selective signal, further comprising a phase comparator, which compares said input data signal to said recovery clock, thus outputting to said charge pump an up-signal and down-signal, with pulse width of said down-signal being:

(a) equal to that of said up-signal when rising edge of said recovery clock (CLOCK) falls at the center of said input data signal;

(b) longer than that of said up-signal when the phase of said input data signal is advanced forward that of said recovery clock; otherwise, (c) shorter than that of said up-signal when the phase of said recovery clock is advanced forward that of said input data signal.

* * * * *